United States Patent
Hsiao et al.

(10) Patent No.: US 10,770,565 B2
(45) Date of Patent: Sep. 8, 2020

(54) MEMORY STRUCTURE AND MANUFACTURING METHOD THEREOF

(71) Applicant: United Microelectronics Corp., Hsinchu (TW)

(72) Inventors: Hsueh-Chun Hsiao, Hsinchu County (TW); Tzu-Yun Chang, Hsinchu County (TW); Chuan-Fu Wang, Miaoli County (TW); Yu-Huang Yeh, Hsinchu (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 16/123,868

(22) Filed: Sep. 6, 2018

(65) Prior Publication Data

US 2020/0083344 A1    Mar. 12, 2020

(51) Int. Cl.
| | | |
|---|---|---|
| H01L 29/66 | (2006.01) | |
| H01L 29/78 | (2006.01) | |
| H01L 29/788 | (2006.01) | |
| H01L 29/792 | (2006.01) | |
| H01L 29/45 | (2006.01) | |
| H01L 29/49 | (2006.01) | |

(52) U.S. Cl.
CPC ......... *H01L 29/665* (2013.01); *H01L 29/456* (2013.01); *H01L 29/49* (2013.01); *H01L 29/6653* (2013.01); *H01L 29/6656* (2013.01); *H01L 29/66825* (2013.01); *H01L 29/66833* (2013.01); *H01L 29/788* (2013.01); *H01L 29/7831* (2013.01); *H01L 29/792* (2013.01)

(58) Field of Classification Search
None
See application file for complete search history.

(56) References Cited

U.S. PATENT DOCUMENTS

| | | | |
|---|---|---|---|
| 7,045,848 B2 | 5/2006 | Shukuri | |
| 2008/0076221 A1* | 3/2008 | Kang | B82Y 10/00 438/267 |
| 2010/0059810 A1* | 3/2010 | Homma | H01L 27/11 257/324 |
| 2014/0252445 A1* | 9/2014 | Chen | H01L 29/42328 257/316 |
| 2015/0087123 A1 | 3/2015 | Wu et al. | |
| 2017/0141201 A1 | 5/2017 | Fang et al. | |

* cited by examiner

*Primary Examiner* — Thien F Tran
(74) *Attorney, Agent, or Firm* — J.C. Patents

(57) ABSTRACT

A memory structure including a substrate, a first gate structure, a second gate structure, a first spacer, a second spacer, and a third spacer is provided. The first gate structure includes a first gate and a charge storage layer. The charge storage layer is disposed between the first gate and the substrate. The second gate structure is disposed on the substrate. The second gate structure includes a second gate. A height of the first gate is higher than a height of the second gate. The first spacer and the second spacer are respectively disposed on one sidewall and the other sidewall of the first gate structure. The first spacer is located between the first gate structure and the second gate structure. The third spacer is disposed on a sidewall of the first spacer and covers a portion of a top surface of the second gate.

20 Claims, 4 Drawing Sheets

MEMORY STRUCTURE AND MANUFACTURING METHOD THEREOF

BACKGROUND OF THE INVENTION

Field of the Invention

The invention relates to a semiconductor structure and a manufacturing method thereof, and particularly relates to a memory structure and a manufacturing method thereof.

Description of Related Art

In the process of memory structure, it is difficult to accurately form a salicide block (SAB) layer between the memory cell structure and the select gate structure by a patterning process. As a result, it is difficult to control the formation position of the subsequently formed metal silicide, thereby causing a decrease in the yield and reliability of the memory device.

SUMMARY OF THE INVENTION

The invention provides a memory structure and a manufacturing method thereof which can accurately control the formation position of the subsequently formed metal silicide.

The invention provides a memory structure, which includes a substrate, a first gate structure, a second gate structure, a first spacer, a second spacer, and a third spacer. The first gate structure includes a first gate and a charge storage layer. The first gate is disposed on the substrate. The charge storage layer is disposed between the first gate and the substrate. The second gate structure is disposed on the substrate at one side of the first gate structure. The second gate structure includes a second gate. A height of the first gate is higher than a height of the second gate. The first spacer and the second spacer are respectively disposed on one sidewall and the other sidewall of the first gate structure. The first spacer is located between the first gate structure and the second gate structure. The third spacer is disposed on a sidewall of the first spacer and covers a portion of a top surface of the second gate.

According to an embodiment of the invention, in the memory structure, a height of the first spacer may be higher than the height of the second gate.

According to an embodiment of the invention, in the memory structure, the first gate structure may further include a first dielectric layer and a second dielectric layer. The first dielectric layer is disposed between the charge storage layer and the substrate. The second dielectric layer is disposed between the first gate and the charge storage layer.

According to an embodiment of the invention, in the memory structure, the second gate structure may further include a third dielectric layer. The third dielectric layer is disposed between the second gate and the substrate.

According to an embodiment of the invention, the memory structure may further include a fourth spacer. The fourth spacer is disposed on a sidewall of the second gate away from the first gate structure.

According to an embodiment of the invention, the memory structure may further include a fifth spacer. The fifth spacer is disposed on the second spacer.

According to an embodiment of the invention, the memory structure may further include a sixth spacer. The sixth spacer is disposed on the third spacer.

According to an embodiment of the invention, the memory structure may further include a first metal silicide layer, a second metal silicide layer, a third metal silicide layer, and a fourth metal silicide layer. The first metal silicide layer is disposed on the first gate. The second metal silicide layer is disposed on the top surface of the second gate exposed by the third spacer. The third metal silicide layer is disposed on the substrate at one side of the first gate structure. The fourth metal silicide layer disposed on the substrate at the other side of the first gate structure.

The invention provides a method of manufacturing a memory structure, which includes the following steps. A first gate structure is formed on a substrate. The first gate structure includes a first gate and a charge storage layer. The first gate is disposed on the substrate. The charge storage layer is disposed between the first gate and the substrate. A second gate structure is formed on the substrate at one side of the first gate structure. The second gate structure includes a second gate. A height of the first gate is higher than a height of the second gate. A first spacer and a second spacer are respectively formed on one sidewall and the other sidewall of the first gate structure. The first spacer is located between the first gate structure and the second gate structure. A third spacer is formed on a sidewall of the first spacer. The third spacer covers a portion of a top surface of the second gate.

According to an embodiment of the invention, in the method of manufacturing the memory structure, a height of the first spacer may be higher than the height of the second gate.

According to an embodiment of the invention, the method of manufacturing the memory structure may further include forming a fourth spacer on a sidewall of the second gate away from the first gate structure.

According to an embodiment of the invention, the method of manufacturing the memory structure may further include forming a fifth spacer on the second spacer.

According to an embodiment of the invention, the method of manufacturing the memory structure may further include forming a sixth spacer on the third spacer.

According to an embodiment of the invention, in the method of manufacturing the memory structure, a method of forming the third spacer may include the following steps. A second gate material layer covering the first gate structure is formed. A portion of the second gate material layer is removed until a top surface of the second gate material layer is lower than a top surface of the first gate. A spacer material layer is conformally formed on the first gate structure and the second gate material layer. An etch-back process is performed on the spacer material layer to form the third spacer on the first spacer and a seventh spacer on the second spacer. The seventh spacer is removed.

According to an embodiment of the invention, in the method of manufacturing the memory structure, a method of removing the portion of the second gate material layer may include an etch-back method or a combination of a chemical mechanical polishing (CMP) method and the etch-back method.

According to an embodiment of the invention, in the method of manufacturing the memory structure, a method of forming the second gate may include patterning the second gate material layer.

According to an embodiment of the invention, in the method of manufacturing the memory structure, the first gate structure may further include a first dielectric layer and a second dielectric layer. The first dielectric layer is disposed between the charge storage layer and the substrate. The second dielectric layer is disposed between the first gate and the charge storage layer.

According to an embodiment of the invention, in the method of manufacturing the memory structure, the first gate structure may further include a cap layer. The cap layer is disposed on the first gate.

According to an embodiment of the invention, the method of manufacturing the memory structure may further include the following steps. A first metal silicide layer is formed on the first gate. The cap layer is removed before the first metal silicide layer is formed. A second metal silicide layer is formed on the top surface of the second gate exposed by the third spacer. A third metal silicide layer is formed on the substrate at one side of the first gate structure. A fourth metal silicide layer is formed on the substrate at the other side of the first gate structure.

According to an embodiment of the invention, in the method of manufacturing the memory structure, the second gate structure may further include a third dielectric layer. The third dielectric layer is disposed between the second gate and the substrate.

Based on the above description, in the memory structure and the manufacturing method thereof, the third spacer is disposed on the sidewall of the first spacer and covers a portion of the top surface of the second gate. Therefore, the formation position of the subsequently formed metal silicide can be accurately controlled by the third spacer, and the yield and reliability of the memory device can be improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1H are schematic cross-sectional views illustrating a manufacturing method of a memory structure according to an embodiment of the invention.

Figure 1A:
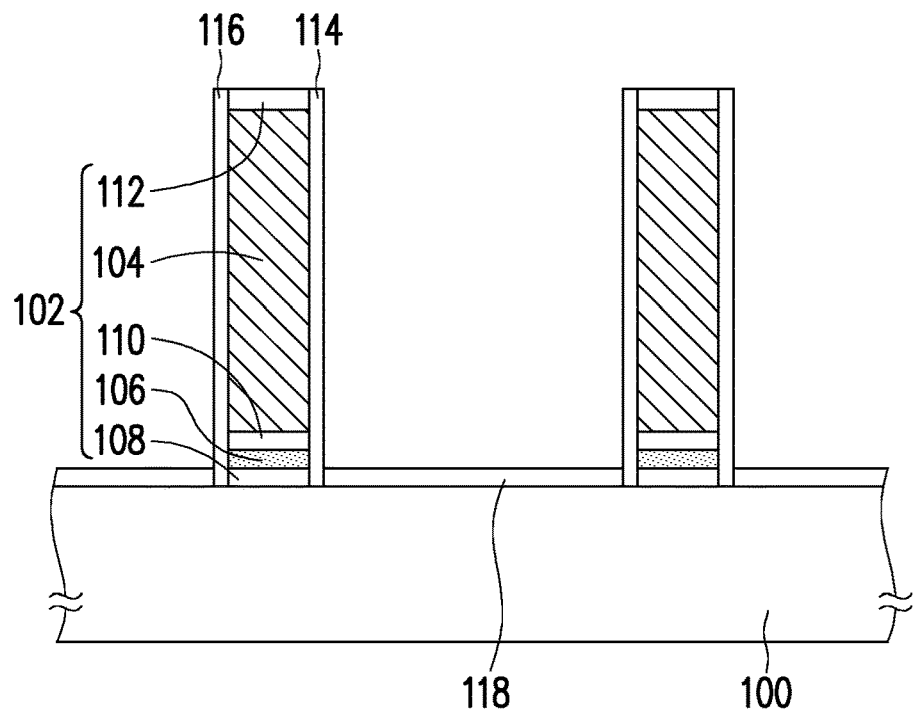
FIG. 1A to FIG. 1H are schematic cross-sectional views illustrating a manufacturing method of a memory structure according to an embodiment of the invention.

Referring to FIG. 1A, a gate structure 102 is formed on a substrate 100. The substrate 100 may be a semiconductor substrate, such as a silicon substrate. The gate structure 102 may be used as a memory cell structure.

The gate structure 102 includes a gate 104 and a charge storage layer 106. The gate structure 102 may further include at least one of a dielectric layer 108, a dielectric layer 110, and a cap layer 112. The gate 104 is disposed on the substrate 100. The material of the gate 104 is, for example, doped polysilicon. The charge storage layer 106 is disposed between the gate 104 and the substrate 100. The charge storage layer 106 may be a charge trapping layer or a floating gate. In the present embodiment, the charge storage layer 106 is exemplified by the charge trapping layer, but the invention is not limited thereto. The material of the charge trapping layer is, for example, silicon nitride. The material of the floating gate is, for example, doped polysilicon. The dielectric layer 108 is disposed between the charge storage layer 106 and the substrate 100. The dielectric layer 110 is disposed between the gate 104 and the charge storage layer 106. The cap layer 112 is disposed on the gate 104. The material of the dielectric layer 108, the dielectric layer 110, and the cap layer 112 is, for example, silicon oxide. The method of forming the gate structure 102 is, for example, a combination of a deposition method, a lithography method and an etching method.

A spacer 114 and a spacer 116 are respectively formed on one sidewall and the other sidewall of the gate structure 102. The spacer 114 and the spacer 116 may be respectively a single-layer structure or a multilayer structure. The multilayer structure is, for example, a composite layer having a silicon oxide layer/a silicon nitride layer/a silicon oxide layer (ONO). The single-layer structure is, for example, a silicon oxide layer. The method of forming the spacer 114 and the spacer 116 may include following steps. A spacer material layer (not shown) is conformally formed on the gate structure 102, and then an etch-back process is performed on the spacer material layer to form the spacer 114 and the spacer 116.

A dielectric layer 118 may be formed on the substrate exposed by the gate structure 102, the spacer 114, and the spacer 116. The material of the dielectric layer 118 is, for example, silicon oxide. The method of forming the dielectric layer 118 is, for example, a thermal oxidation method or a chemical vapor deposition (CVD) method.

Figure 1B:
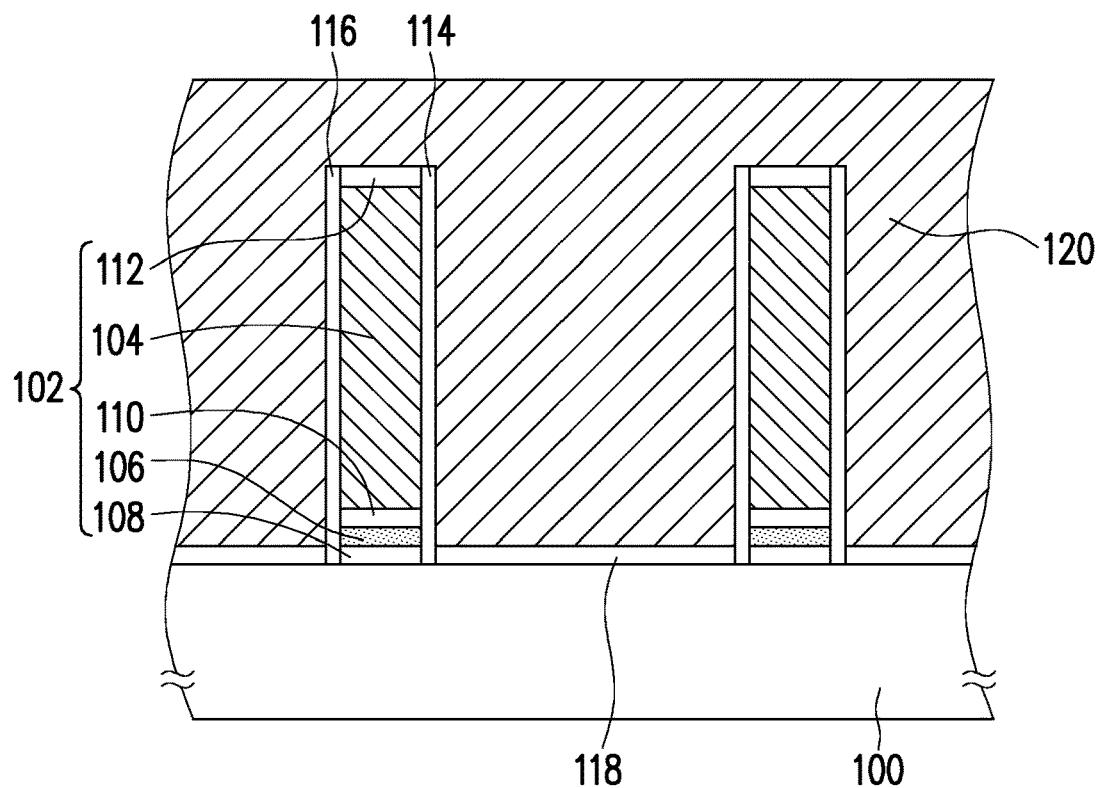

Referring to FIG. 1B, a gate material layer 120 covering the gate structure 102 is formed. The material of the gate material layer 120 is, for example, doped polysilicon. The method of forming the gate material layer 120 is, for example, a CVD method.

Figure 1C:
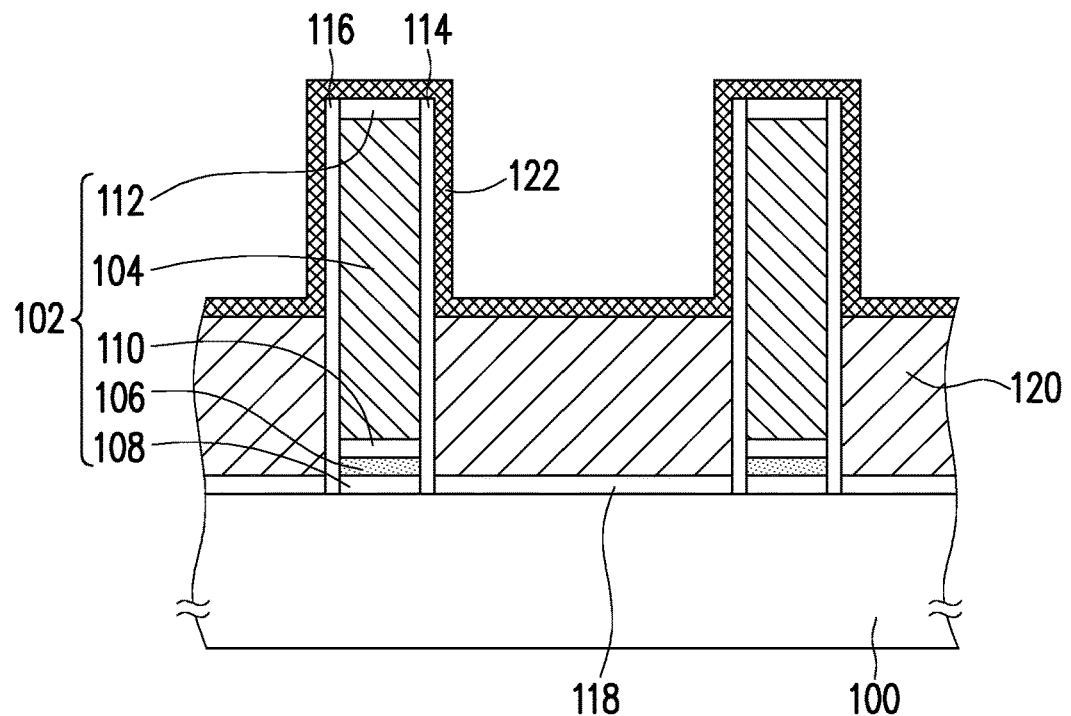
Figure 1D:
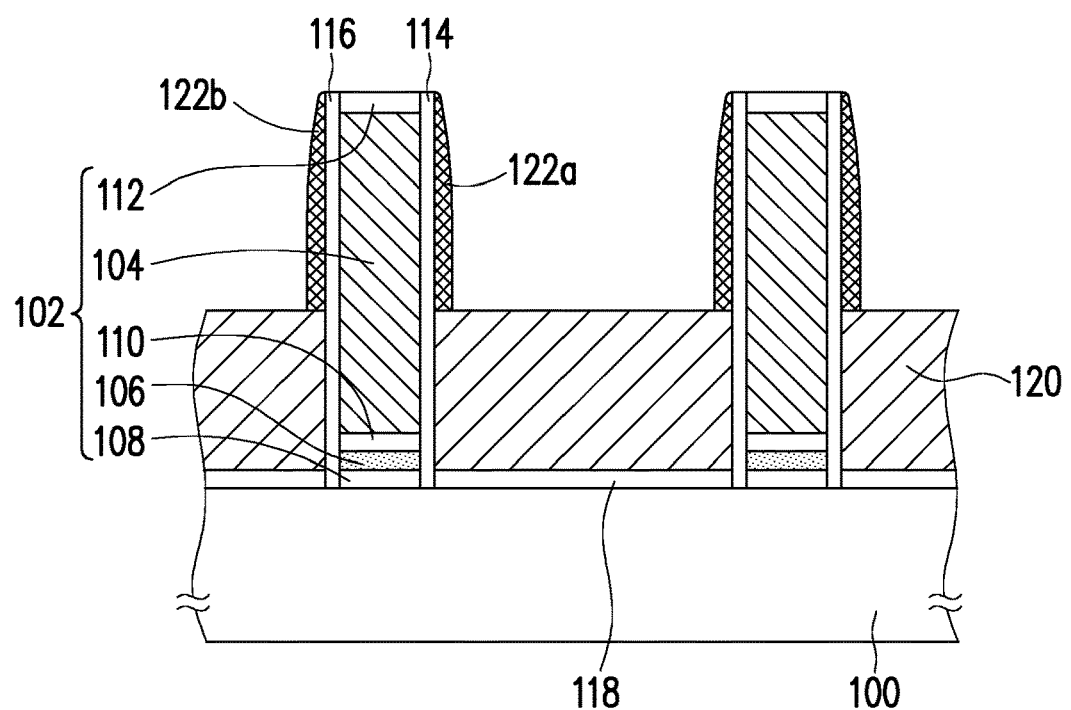

Referring to FIG. 1C, a portion of the gate material layer 120 is removed until the top surface of the gate material layer 120 is lower than the top surface of the gate 104. A method of removing the portion of the gate material layer 120 may include an etch-back method or a combination of a chemical mechanical polishing (CMP) method and the etch-back method. For example, a CMP process is performed on the gate material layer 120, and then an etch-back process is performed on the gate material layer 120.

A spacer material layer 122 is conformally formed on the gate structure 102 and the gate material layer 120. The material of the spacer material layer 122 is, for example, silicon nitride. The method of forming the spacer material layer 122 is, for example, a CVD method Referring to FIG. 1D, an etch-back process is performed on the spacer material layer 122 to form a spacer 122a on the spacer 114 and a spacer 122b on the spacer 116. In the present embodiment, the spacer 122a is formed on the sidewall of spacer 114. The etch-back process is, for example, a dry etching process.

Figure 1E:
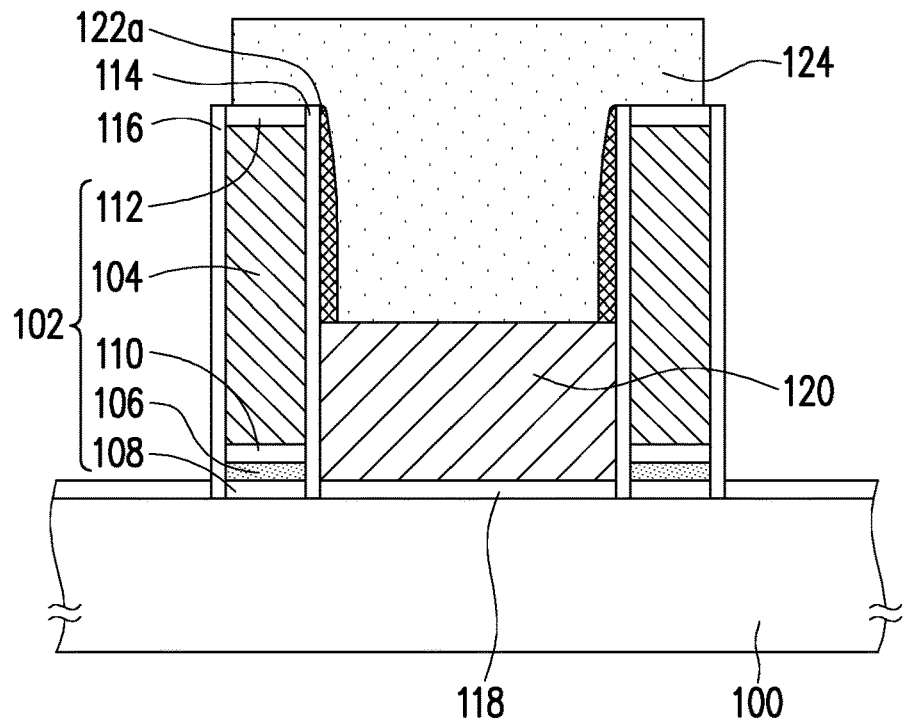

Referring to FIG. 1E, a patterned photoresist layer 124 may be formed, wherein the patterned photoresist layer 124 may cover the spacer 122a and a portion of the gate material layer 120 at one side of the gate structure 102. The patterned photoresist layer 124 may further cover the cap layer 112 and the spacer 114. The method of forming the patterned photoresist layer 124 is, for example, a lithography method.

The spacer 122b exposed by the patterned photoresist layer 124 is removed. The method of removing the spacer 122b is, for example, a wet etching method.

A portion of the gate material layer 120 exposed by the patterned photoresist layer 124 is removed. The method of removing the portion of the gate material layer 120 is, for example, a dry etching method.

Figure 1F:
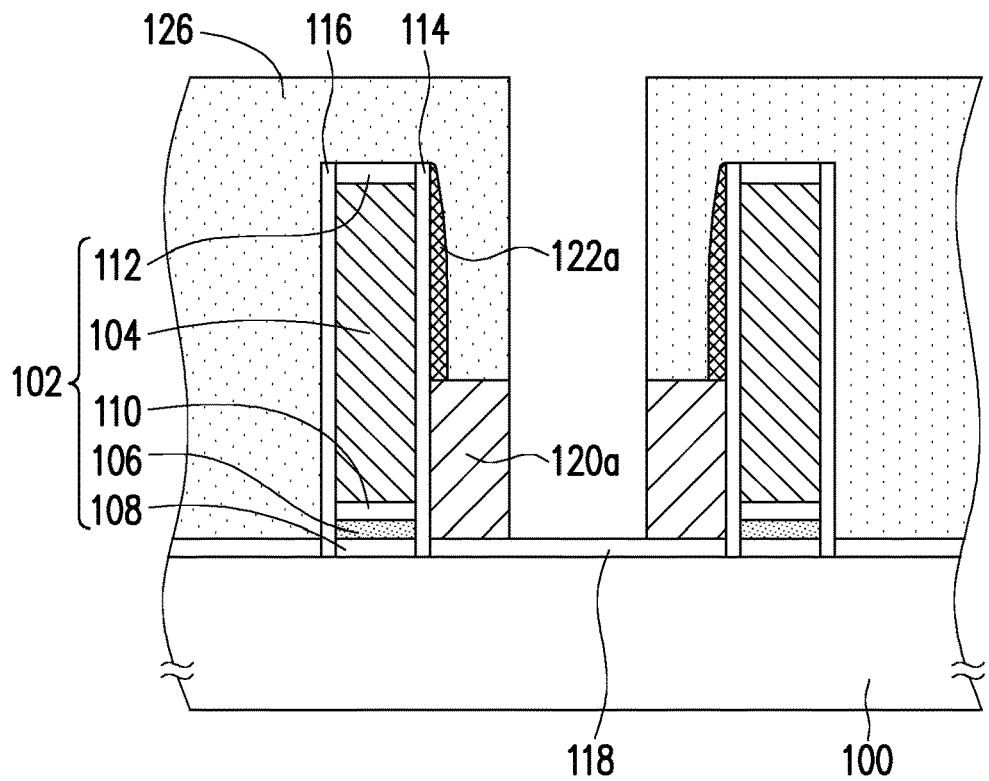

Referring to FIG. 1F, the patterned photoresist layer 124 is removed. The method of removing the patterned photoresist layer 124 is, for example, a dry stripping method or a wet stripping method.

A patterned photoresist layer 126 is formed, wherein the patterned photoresist layer 126 may cover a portion of the gate material layer 120. The patterned photoresist layer 126 may further cover the spacer 122a, the spacer 114, the cap layer 112, the spacer 116, and the dielectric layer 118. The method of forming the patterned photoresist layer 126 is, for example, a lithography method.

The gate material layer 120 exposed by the patterned photoresist layer 126 is removed to form a gate 120a at one side of the gate structure 102. The height of the gate 104 is higher than the height of the gate 120a. The height of the spacer 114 may be higher than the height of the gate 120a. The spacer 122a covers a portion of a top surface of the gate 120a. The method of removing gate material layer 120 exposed by the patterned photoresist layer 126 is, for example, a dry etching method. The method of forming the gate 120a may include patterning the gate material layer 120 by the abovementioned method, but the invention is not limited thereto.

Figure 1G:
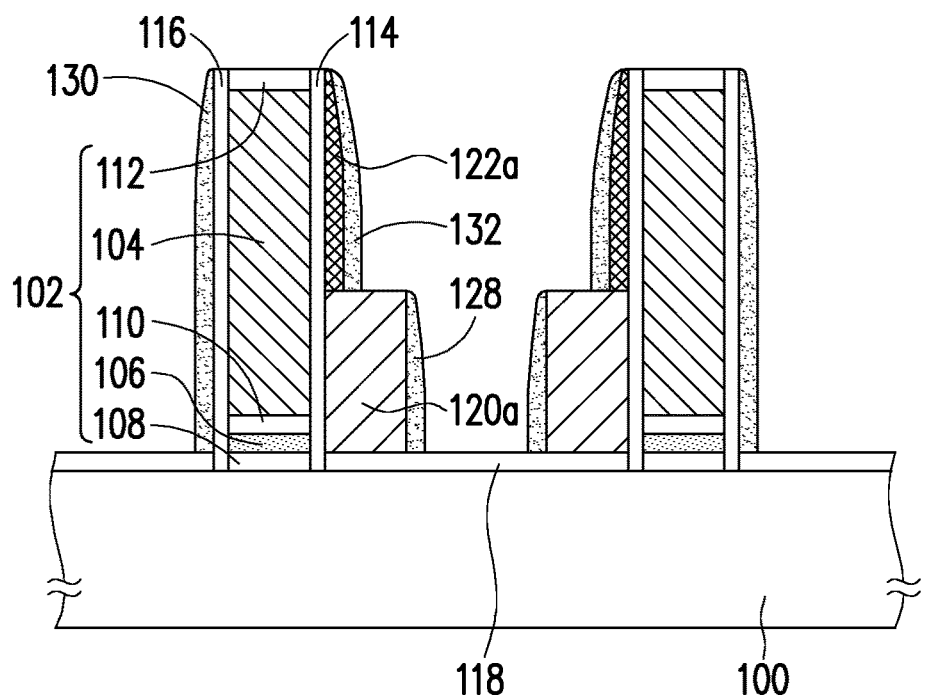

Referring to FIG. 1G, the patterned photoresist layer 126 is removed. The method of removing the patterned photoresist layer 126 is, for example, a dry stripping method or a wet stripping method.

A spacer 128 may be formed on a sidewall of the gate 120a away from the gate structure 102. A spacer 130 may be formed on the spacer 116. A spacer 132 may be formed on the spacer 122a. The material of the spacer 128, the spacer 130, and spacer 132 is, for example, silicon nitride. The method of forming the spacer 128, the spacer 130 and spacer 132 may include the following steps. A spacer material layer (not shown) is conformally formed on the gate 120a, the spacer 116, the spacer 122a, and the cap layer 112, and then an etch-back process is performed on the spacer material layer to form the spacer 128, the spacer 130, and spacer 132. In the present embodiment, the spacer 128, the spacer 130, and spacer 132 may be simultaneously formed by the same process, but the invention is not limited thereof.

Figure 1H:
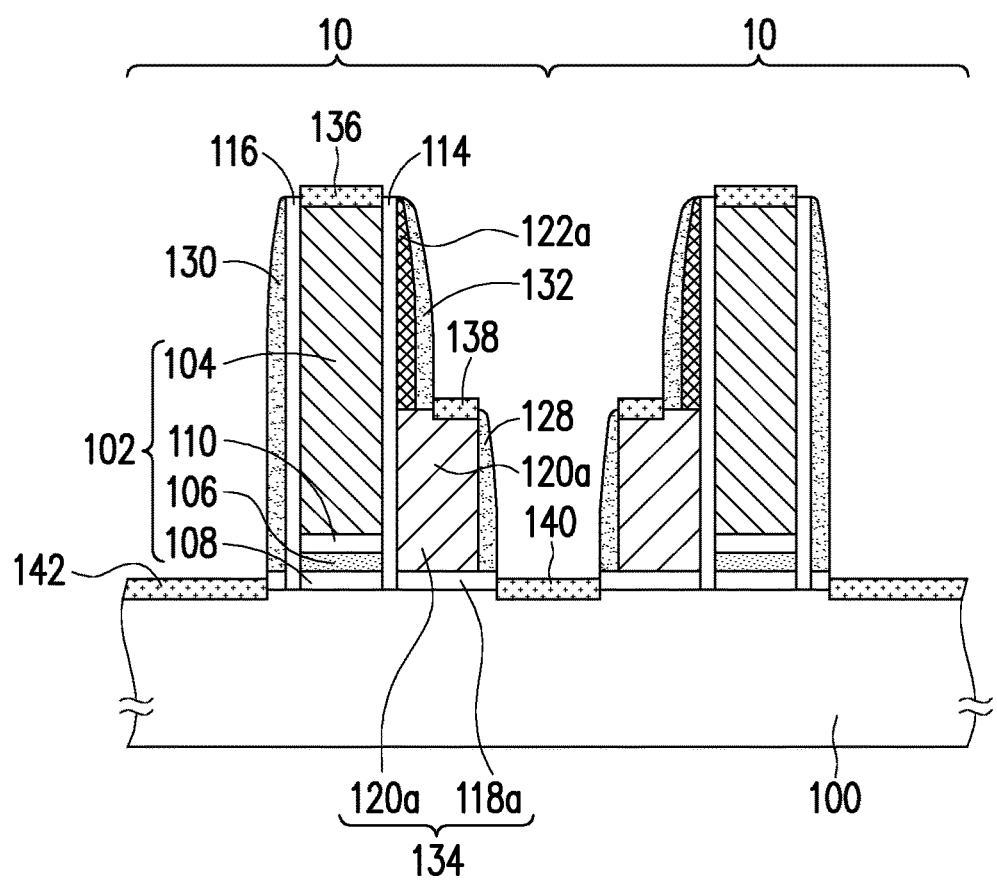

Referring to FIG. 1H, the cap layer 112 may be removed to exposed the gate 104. A portion of the dielectric layer 118 not covered by the gate 120a, the spacer 128, and the spacer 130 may be removed to expose a portion of the substrate 100 and form a dielectric layer 118a, wherein the dielectric layer 118a is located between the gate 120a and the substrate 100. The cap layer 112 and the portion of the dielectric layer 118 may be simultaneously or separately removed by performing an etching process, but the invention is not limited thereto. By the abovementioned method, a gate structure 134 is formed on the substrate 100 at one side of the gate structure 102. The gate structure 134 includes a gate 120a and may further include a dielectric layer 118a. The dielectric layer 118a is disposed between the gate 120a and the substrate 100. The spacer 114 is located between the gate structure 102 and the gate structure 134. The method of forming the gate structure 134 is exemplified by the abovementioned method, but the invention is not limited thereto.

A metal silicide layer 136 is formed on the gate 104. A metal silicide layer 138 is formed on the top surface of the gate 120a exposed by the spacer 122a. A metal silicide layer 140 is formed on the substrate 100 at one side of the gate structure 102. A metal silicide layer 142 is formed on the substrate 100 at the other side of the gate structure 102. The material of the metal silicide layer 136, metal silicide layer 138, metal silicide layer 140, and the metal silicide layer 142 is, for example, cobalt silicide or nickel silicide. The method of forming material of the metal silicide layer 136, metal silicide layer 138, metal silicide layer 140, and the metal silicide layer 142 is, for example, performing a salicidation process.

In the following, the memory structure 10 of the above embodiments is described with FIG. 1H.

Referring to FIG. 1H, in one embodiment, the memory structure 10 includes a substrate 100, a gate structure 102, a gate structure 134, a spacer 114, a spacer 116, and a spacer 122a. Based on product design requirement, one or more desired doped regions (not shown) may be formed in the substrate 100. The gate structure 102 includes a gate 104 and a charge storage layer 106. The gate 104 is disposed on the substrate 100. The charge storage layer 106 is disposed between the gate 104 and the substrate 100. The gate structure 102 may further include a dielectric layer 108 and a dielectric layer 110. The dielectric layer 108 is disposed between the charge storage layer 106 and the substrate 100. The dielectric layer 110 is disposed between the gate 104 and the charge storage layer 106. The gate structure 134 is disposed on the substrate 100 at one side of the gate structure 102. The gate structure 134 includes a gate 120a and may further include a dielectric layer 118a. The dielectric layer 118a is disposed between the gate 120a and the substrate 100. In two adjacent memory structures 10, two gate structures 134 may be located between two adjacent gate structure 102. The height of the gate 104 is higher than a height of the gate 120a. The spacer 114 and the spacer 116 are respectively disposed on one sidewall and the other sidewall of the gate structure 102. The spacer 114 is located between the gate structure 102 and the gate structure 134. The spacer 122a is disposed on a sidewall of the spacer 114 and covers a portion of a top surface of the gate 120a. The height of the spacer 114 may be higher than the height of the gate 120a.

The memory structure 10 include may further include at least one of a spacer 128, a spacer 130, a spacer 132, a metal silicide layer 136, a metal silicide layer 138, a metal silicide layer 140, and a metal silicide layer 142. The spacer 128 is disposed on a sidewall of the gate 120a away from the gate structure 102. The spacer 130 is disposed on the spacer 116. The spacer 132 is disposed on the spacer 122a. The metal silicide layer 136 is disposed on the gate 104. The metal silicide layer 138 is disposed on the top surface of the gate 120a exposed by the spacer 122a and the spacer 132. The metal silicide layer 140 is disposed on the substrate 100 at one side of the gate structure 102. The metal silicide layer 142 disposed on the substrate 100 at the other side of the gate structure 102.

In addition, the material, the arrangement, the forming method, the effect, and the like of each component in the memory structure 10 of FIG. 1H are described in detail in the embodiments above and are not repeated herein.

Based on the above description, in the memory structure 10 and the manufacturing method thereof, the spacer 122a is disposed on the sidewall of the spacer 114 and covers a portion of the top surface of the gate 120a. Therefore, the formation position of the subsequently formed metal silicide 138 can be accurately controlled by the spacer 122a, and the yield and reliability of the memory device can be improved.

In summary, in the memory structure of the aforementioned embodiments and the method of manufacturing the same, the metal silicide can be accurately formed on the predetermined position by the spacer. Therefore, the yield and reliability of the memory device can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a substrate;
   a first gate structure comprising:
      a first gate disposed on the substrate; and
      a charge storage layer disposed between the first gate and the substrate;
   a second gate structure disposed on the substrate at one side of the first gate structure, wherein the second gate structure comprises a second gate, and a height of the first gate is higher than a height of the second gate;
   a first spacer and a second spacer respectively disposed on one sidewall and the other sidewall of the first gate structure, wherein the first spacer is located between the first gate structure and the second gate structure; and
   a third spacer disposed on a sidewall of the first spacer and covering a portion of a top surface of the second gate, wherein
   a top surface of the charge storage layer is lower than the entire top surface of the second gate, and
   the first spacer covers a sidewall of the charge storage layer.

2. The memory structure according to claim 1, wherein a height of the first spacer is higher than the height of the second gate, and the portion of the top surface of the second gate covered by the third spacer is parallel to a top surface of the substrate.

3. The memory structure according to claim 1, wherein the first gate structure further comprises:
   a first dielectric layer disposed between the charge storage layer and the substrate; and
   a second dielectric layer disposed between the first gate and the charge storage layer.

4. The memory structure according to claim 1, wherein the second gate structure further comprises:
   a third dielectric layer disposed between the second gate and the substrate.

5. The memory structure according to claim 1, further comprising:
   a fourth spacer disposed on a sidewall of the second gate away from the first gate structure.

6. The memory structure according to claim 1, further comprising:
   a fifth spacer disposed on the second spacer.

7. The memory structure according to claim 1, further comprising:
   a sixth spacer disposed on the third spacer.

8. The memory structure according to claim 1, further comprising:
   a first metal silicide layer disposed on the first gate;
   a second metal silicide layer disposed on the top surface of the second gate exposed by the third spacer;
   a third metal silicide layer disposed on the substrate at one side of the first gate structure; and
   a fourth metal silicide layer disposed on the substrate at the other side of the first gate structure.

9. A method of manufacturing a memory structure, comprising:
   forming a first gate structure on a substrate, wherein the first gate structure comprises:
      a first gate disposed on the substrate; and
      a charge storage layer disposed between the first gate and the substrate;
   forming a second gate structure on the substrate at one side of the first gate structure, wherein the second gate structure comprises a second gate, and a height of the first gate is higher than a height of the second gate;
   forming a first spacer and a second spacer respectively on one sidewall and the other sidewall of the first gate structure, wherein the first spacer is located between the first gate structure and the second gate structure; and
   forming a third spacer on a sidewall of the first spacer, wherein the third spacer covers a portion of a top surface of the second gate, a top surface of the charge storage layer is lower than the entire top surface of the second gate, and the first spacer covers a sidewall of the charge storage layer.

10. The method of manufacturing the memory structure according to claim 9, wherein a height of the first spacer is higher than the height of the second gate.

11. The method of manufacturing the memory structure according to claim 9, further comprising:
    forming a fourth spacer on a sidewall of the second gate away from the first gate structure.

12. The method of manufacturing the memory structure according to claim 9, further comprising:
    forming a fifth spacer on the second spacer.

13. The method of manufacturing the memory structure according to claim 9, further comprising:
    forming a sixth spacer on the third spacer.

14. The method of manufacturing the memory structure according to claim 9, wherein a method of forming the third spacer comprising:
    forming a second gate material layer covering the first gate structure;
    removing a portion of the second gate material layer until a top surface of the second gate material layer is lower than a top surface of the first gate;
    conformally forming a spacer material layer on the first gate structure and the second gate material layer;
    performing an etch-back process on the spacer material layer to form the third spacer on the first spacer and a seventh spacer on the second spacer; and
    removing the seventh spacer.

15. The method of manufacturing the memory structure according to claim 14, wherein a method of removing the portion of the second gate material layer comprises an etch-back method or a combination of a chemical mechanical polishing method and the etch-back method.

16. The method of manufacturing the memory structure according to claim 14, wherein a method of forming the second gate comprising:
    patterning the second gate material layer.

17. The method of manufacturing the memory structure according to claim 9, wherein the first gate structure further comprises:
    a first dielectric layer disposed between the charge storage layer and the substrate; and
    a second dielectric layer disposed between the first gate and the charge storage layer.

18. The method of manufacturing the memory structure according to claim 9, wherein the first gate structure further comprises:
    a cap layer disposed on the first gate.

19. The method of manufacturing the memory structure according to claim 18, further comprising:

forming a first metal silicide layer on the first gate, wherein the cap layer is removed before the first metal silicide layer is formed;

forming a second metal silicide layer on the top surface of the second gate exposed by the third spacer;

forming a third metal silicide layer on the substrate at one side of the first gate structure; and forming a fourth metal silicide layer on the substrate at the other side of the first gate structure.

20. The method of manufacturing the memory structure according to claim 9, wherein the second gate structure further comprises:

a third dielectric layer disposed between the second gate and the substrate.

* * * * *